United States Patent
Jung et al.

[11] Patent Number: 6,111,316
[45] Date of Patent: Aug. 29, 2000

[54] ELECTRONIC COMPONENT ENCAPSULATED IN A GLASS TUBE

[75] Inventors: Kyu Jin Jung, Kgongki-Do, Rep. of Korea; Sury N. Darbha, Tempe; Austin S. Kaercher, Phoenix, both of Ariz.; Myungseok Jang, Seoul, Rep. of Korea

[73] Assignee: Motorola, Inc., Schaumburg, Ill.

[21] Appl. No.: 08/920,840

[22] Filed: Aug. 29, 1997

[51] Int. Cl.⁷ .................................................. H01L 23/34
[52] U.S. Cl. ..................... 257/713; 257/712; 257/717; 257/794
[58] Field of Search .................................... 257/634, 780, 257/794, 688, 689, 762, 787, 712, 713, 717; 501/33, 76, 22, 26

[56] References Cited

U.S. PATENT DOCUMENTS

| | | | |
|---|---|---|---|
| 3,361,589 | 1/1968 | Garceau | 29/588 |
| 3,723,835 | 3/1973 | Davis et al. | 257/794 |
| 3,844,029 | 10/1974 | Dibugnara | 29/588 |
| 3,945,111 | 3/1976 | Greeson et al. | 29/588 |
| 3,950,142 | 4/1976 | Brenan et al. | 29/191 |
| 3,964,920 | 6/1976 | Davis et al. | 501/15 |
| 3,987,217 | 10/1976 | Greeson et al. | 427/123 |
| 3,996,602 | 12/1976 | Goldberg et al. | 257/790 |
| 4,042,951 | 8/1977 | Robinson et al. | 257/794 |
| 4,059,837 | 11/1977 | Suzuki et al. | 257/780 |
| 4,131,478 | 12/1978 | Davis et al. | 501/15 |
| 4,146,655 | 3/1979 | Davis et al. | 438/127 |
| 5,164,813 | 11/1992 | Blackstone et al. | 29/48 |
| 5,623,167 | 4/1997 | Tabuchi | 257/794 |
| 5,942,793 | 8/1999 | Senoo et al. | 257/650 |
| 5,946,586 | 8/1999 | Pukala | 438/492 |

FOREIGN PATENT DOCUMENTS

| | | |
|---|---|---|
| 59-126669 | 7/1984 | Japan . |
| 60-206052 | 10/1985 | Japan . |
| 63-062360 | 3/1988 | Japan . |
| 1-152751 | 6/1989 | Japan . |
| 7-202096 | 8/1995 | Japan . |
| 8-97440 | 4/1996 | Japan . |
| 9-162331 | 6/1997 | Japan . |

*Primary Examiner*—Olik Chaudhuri
*Assistant Examiner*—Alonzo Chambliss
*Attorney, Agent, or Firm*—Anthony M. Martinez

[57] ABSTRACT

An electronic component (10) is formed by encasing individual components within a glass tube (20). The individual components can include a semiconductor die (11), leads (12,13), and dumets (16,17). The glass tube (20) is transparent and melts at a temperature less than other commercially available materials.

11 Claims, 1 Drawing Sheet

ELECTRONIC COMPONENT ENCAPSULATED IN A GLASS TUBE

BACKGROUND OF THE INVENTION

This invention relates, in general, to semiconductor devices, and more particularly, to electronic components formed in a glass-type package.

Conventional discrete devices such as diodes, resistors, capacitors, etc., are typically packaged into ceramic or opaque glass packages. A package is formed by placing the individual components of a discrete device, such as the leads, slug, and semiconductor die, in a glass tube. The components are then heated to over 600° Celsius (C.) so that the glass tube melts and encapsulates the individual components to form the protective package of the discrete device.

One problem with this technique is that there is no commercially available process utilizing drawn glass tubing that allows a semiconductor package to be formed under 590° C. that is also optically transparent. This is a problem because advanced semiconductor devices often include metal interconnect or doped structures that are extremely sensitive to temperature. For example, if a semiconductor die used to form the semiconductor device includes aluminum for junction material or contact metallization, care must be taken not to exceed a package assembly temperatures above 600° C. or else the aluminum may melt and diffuse into the semiconductor die.

Accordingly, it would be advantageous to provide a method for forming a semiconductor package that is formed at a lower temperature than conventional packages. It would also be advantageous if the package were clear so that the individual components of the semiconductor device could be visually inspected.

Figure 1:
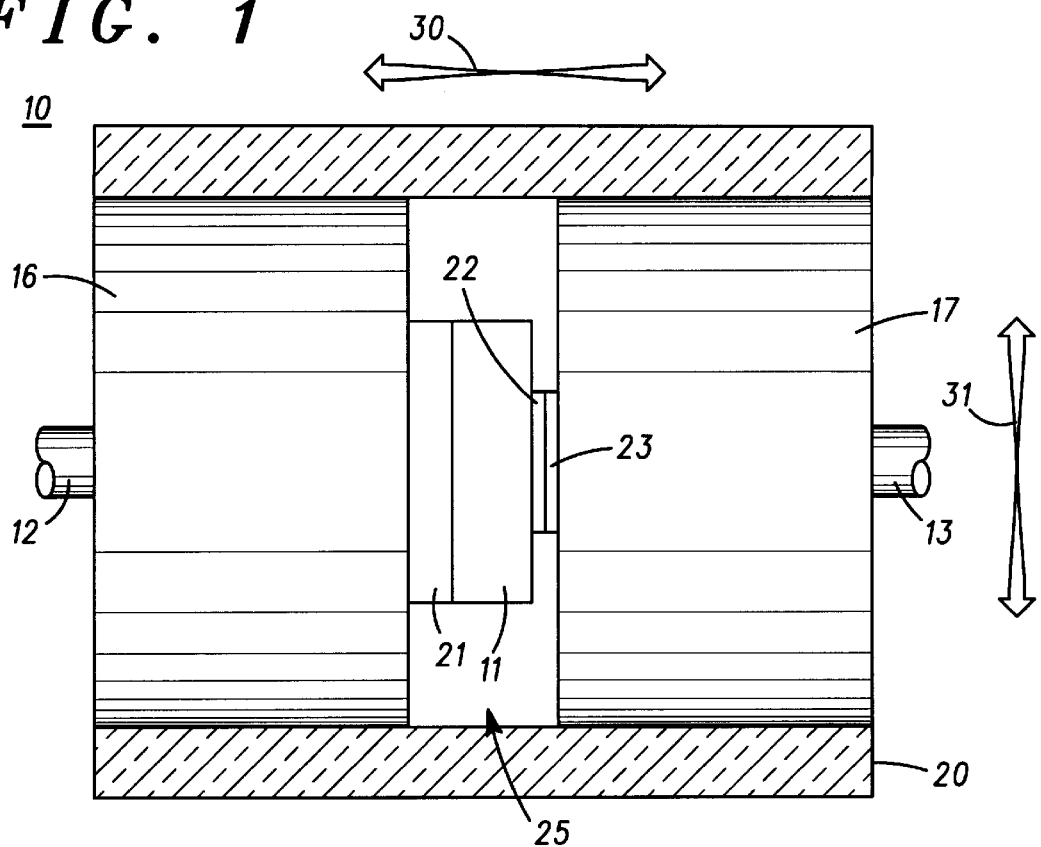
FIG. 1 is an enlarged cross-sectional view of an electronic component at an early stage of manufacture in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged cross-sectional view of a portion of an apparatus referred to as an electronic component 10 formed in accordance with the present invention. More particularly, FIG. 1 illustrates the individual components of electronic component 10 at an early stage in the manufacturing process. In the example shown in FIG. 1 and described below, electronic component 10 is a Zener diode. However, it should be understood that the present invention has a variety of applications and that electronic component 10 can also be a resistor, a diode, a capacitor, a thyristor, a thermistor, an inductor, or the like.

Electronic component 10 could also be an integrated circuit such as a memory storage device, a chemical sensor, a pressure sensor, an accelerometer, a microprocessor, a microcontroller, or the like.

As illustrated in FIG. 1, electronic component 10 is intended to be configured as a DO-35 package, which is a semiconductor industry package-type designation. It should also be understood that the present invention can be used to form other industry standard packages such as a DO-34, a DO-41, or the like.

As shown in FIG. 1, electronic component 10 includes a semiconductor die 11, which in this example is a Zener diode. Electrical contact to semiconductor die 11 within electronic component 10 is provided by leads 12 and 13 connected to dumets 16 and 17, respectively. Of course it is possible to provide electrical connection to semiconductor die 11 without the use of dumets 16 and 17, but in this example, dumets 16 and 17 provide both electrical connection and the necessary heat dissipation when electronic component 10 is in operation. It should also be understood that the present invention can be used in other applications where leads 12 and 13 might be bonding wires, die flags, or some part of a leadframe.

Preferably, dumets 16 and 17 are made from iron and nickel such that they comprise about 46–48 weight percent iron and about 52–54 weight percent nickel. The advantage of these approximate ratios is that dumets 16 and 17 have an isotropic thermal coefficient of expansion. In other words, dumets 16 and 17 have an axial thermal expansion coefficient (indicated in FIG. 1 with an arrow 30) and a radial thermal expansion coefficient (indicated in FIG. 1 with an arrow 31) that are nearly equal. However, one skilled in the art will appreciate that the respective values need not be exactly equal in order to benefit from the present invention. For example, as long as the radial thermal expansion coefficient is within about 15 percent of the axial thermal expansion coefficient, then electronic component 10 is less likely to suffer from radial cracking during the high temperature processing described below. By reducing the amount of radial cracking that occurs, an electronic component formed in accordance with the present invention has a higher lead pull strength. In some cases, up to 20 pounds between leads 12 and 13.

Continuing with the preferred embodiment, electrical and physical contact is provided between semiconductor die 11 and dumets 16 and 17 with bonding material. For example, the bonding material between dumet 17 and one side of semiconductor die 11 can be a layer of tin 22 and a layer of silver 23. Additionally, just a layer of tin 21 can be used as the bonding material between the other surface of semiconductor die 11 and dumet 16. One advantage of using layers 21–23 to provide bonding between semiconductor die 11 and dumets 16 and 17 is that they do not require thermal-compression bonding to form a physical bond. Instead, a subsequent anneal step is performed so that layers 21–23 properly bond to dumets 16 and 17. This anneal step is described in more detail below.

A glass tube 20 is used as an outer package for electronic component 10 to provide environmental protection and electrical isolation. Preferably, the bulk materials used to make glass tube 20 include silica (i.e., silicon dioxide), lead oxide (PbO), borate ($B_2O_3$), and potassium oxide ($K_2O$). One distinction this list of constituents provides over previously known glass materials is the addition of potassium oxide. The use of potassium oxide not only provides in part for the lower melting temperature of glass tube 20 as explained below, but allows glass tube 20 to be transparent. The use of potassium oxide also enables the capability to draw a tube from a melt using a glass extruding process as explained below. Other oxides derived from the first column of the periodic table may be used such as lithium oxide or sodium oxide. Another distinction of the present invention from previously known processes is that constituents are chosen so that there is no residual carbon in the glass material and the glass material is non-porous.

Other inorganic oxides such as zinc oxide, calcium oxide, magnesium oxide can be included as a minor constituent to reduce the tendency of glass tube 20 to devitrify and to aid in chemical durability.

These inorganic oxides can be added to have about a 1–10 weight percent, or more preferably, a weight percent of about 5–10. It should be understood that the use of these additional inorganic oxides is not necessary to practice the present invention and their use should be considered optional. Table I is provided to list the materials that can be used to form glass tube 20 in their approximate relative weight percentage.

TABLE I

| Component | Weight in Percent |
|---|---|
| PbO | 65–78 |
| $SiO_2$ | 11–15 |
| $B_2O_3$ | 5–10 |
| $K_2O$ | 1–3 |
| $Al_2O_3$ | 1–3 |
| BaO | 1–3 |
| CaO | 1–3 |
| $TiO_2$ | 1–3 |
| $ZrO_2$ | 1–3 |
| ZnO | 1–3 |

Also listed in Table I is alumina ($Al_2O_3$) which is optionally added in about 1–10 weight percent to increase the strength of glass tube 20 so that electronic component 10 is more resistant to stress cracking during its manufacture and operation. In the present invention, the alumina actually melts and becomes one of the melted constituents as shown below. This differs from previously known processes that use alumina as a filler, and thus, the alumina does not become one of the melted ingredients. Preferably, alumina is used in lower quantities than in the previously known glass compounds and is included in about 1–3 weight percent in the melt.

One method of forming glass tube 20 is to place the ingredients listed in Table I in the desired proportion into a heating vat. The constituents are mixed and heated to form a molten melt. A capillary tube (not shown) having the desired inner and outer diameter is then pulled from the heating vat using techniques well known in the art. The capillary tube is then cut to the desired length to provide glass tube 20 such as is shown in FIG. 1. Once formed, glass tube 20 has a softening point at $1 \times 10^{7.6}$ poises ranging from about 470° C. to 490° C., an anneal point at $1 \times 10^{13}$ poises ranging from about 415° C. to 435° C., a transformation point ranging from about 400° C. to 420° C., a strain point at $1 \times 10^{14.5}$ poises ranging from about 375° C. to 395° C., and a coefficient of thermal expansion (CTE) in parts per million/degree Celsius (ppm/° C.) ranging from about 8.5 to 8.75 ppm/° C.

Figure 2:
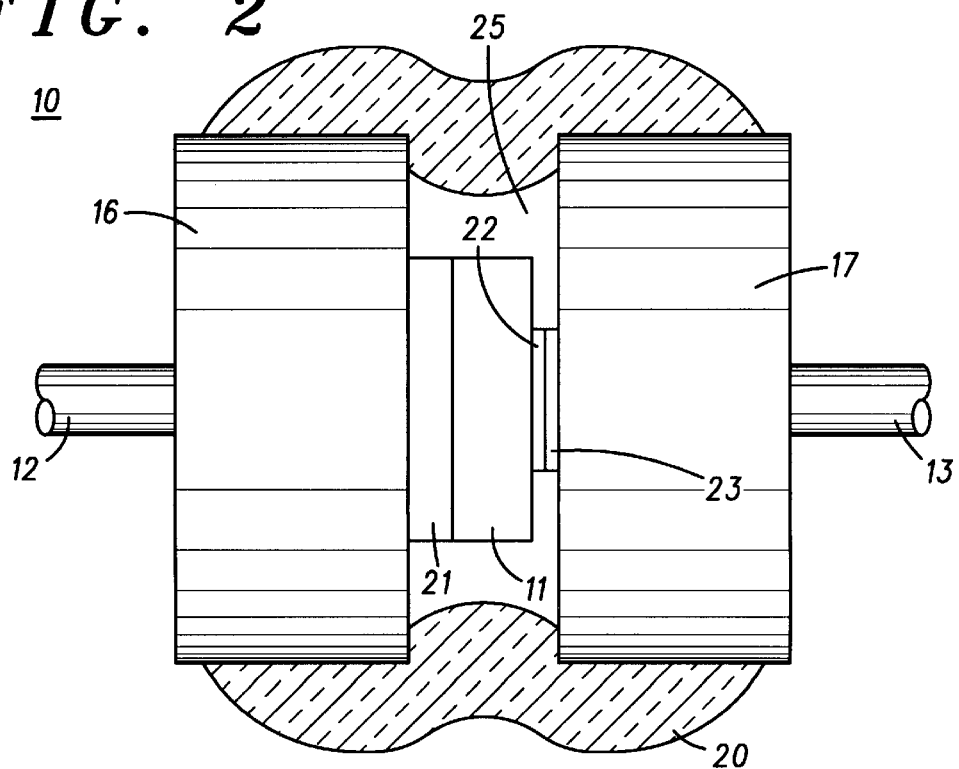
FIG. 2 is an enlarged cross-sectional view of the electronic component after further processing.

As shown in FIG. 1, the manufacture of electronic component 10 continues by placing the individual components (i.e., semiconductor die 11, dumets 16–17, and leads 12–13) within the cavity 25 of glass tube 20. Because glass tube 20 is transparent, it is possible to verify that individual components are properly arranged prior to the melting step to follow. Turning now to FIG. 2, electronic component 10 is heated to about 530° C. to 570° C. for about 5 minutes to 30 minutes so that glass tube 20 melts to encase the individual components of electronic component 10. As shown in FIG. 2, glass tube 20 melts to partially fill cavity 25. This heating step is also used to melt layers 21–23 to provide the desired bonding to dumets 16 and 17. The relative proportion of the constituents in Table I can be varied to adjust the melting temperature of glass tube 20. Three examples are provided using Tables II to IV.

Table II lists the constituents in weight percent so that glass tube 20 has a melting temperature ranging from about 525° C. to 535° C. In addition to having a low melting temperature, the use of potassium oxide and the other constituents in the ratios shown below provides for an encapsulating material that is optically transparent.

TABLE II

| Component | Weight in Percent |
|---|---|
| PbO | 67–80 |
| $SiO_2$ | 5–15 |
| $B_2O_3$ | 5–15 |
| $K_2O$ | 1–5 |
| $Al_2O_3$ | 1–5 |

Table III lists the constituents in weight percent so that glass tube 20 has a melting temperature ranging from about 535° C. to 555° C. A glass material formed using these relative ratios of constituents is also optically transparent.

TABLE III

| Component | Weight in Percent |
|---|---|
| PbO | 67–78 |
| $SiO_2$ | 10–20 |
| $B_2O_3$ | 5–15 |
| $K_2O$ | 1–5 |
| $Al_2O_3$ | 1–3 |

Table IV lists the constituents in weight percent so that glass tube 20 has a melting temperature ranging from about 545° C. to 560° C. As shown below, the amount of lead oxide is reduced and the amount silica is increased. This will increase the coefficient thermal expansion of the glass material so that it ranges from about 7 to 9 ppm/° C.

TABLE IV

| Component | Weight in Percent |
|---|---|
| PbO | 60–70 |
| $SiO_2$ | 10–20 |
| $B_2O_3$ | 5–15 |
| $K_2O$ | 1–5 |
| $Al_2O_3$ | 5–10 |

One advantage of forming glass tube 20 using the materials in Table I is that glass tube 20 has a melting temperature ranging from about 525° C. to 570° C., or more preferably, from about 525° C. to 555° C. This is significantly lower than the melting temperatures of currently available transparent glass tubes, which have a melting temperature in excess of 590° C. and typically melt at 620° C. In contrast, the present invention provides a glass tube that can be used to manufacture electronic components at temperatures below 570° C. This is desirable because in some applications, the individual components used to form an electronic component are sensitive to high temperature processing and cannot tolerate processing temperatures in excess of 600° C.

Another advantage of the present invention is that glass tube 20 is transparent. This is desirable because is allows for visual inspection of the individual components of electronic component 10 during and after the assembly process. It should be understood that glass tube 20 need not be perfectly transparent. If additives such as alumina are used in relatively small quantities, glass tube 20 may be slightly opaque, but yet the internal components of electronic component 10 can still be made out. An unexpected advantage of the present invention is an improvement in the control of both the outer and inner diameter of glass tube 20. For example, the inner diameter of glass tube 20 when electronic component is configures as a DO-35 package ranges from about 0.074 to 0.078 inches or 0.1905 centimeters (cm) to 0.19812 cm, whereas previously known packages range from about 0.070 to 0.085 inches or 0.1778 cm to 0.2159 cm.

By now it should be appreciated that the present invention provides a glass tube that can be used to form a package for electronic components. The glass tube is both transparent and melts at a lower temperature than other commercially available glass tube materials.

What is claimed is:

1. An electronic component comprising:
    a semiconductor die;
    a first lead coupled to the semiconductor die;
    a glass tube that encapsulates the semiconductor die and a dumet, wherein the glass tube is substantially transparent and has a melting temperature of less than about 570 C.; and
    said dumet comprises about 46–48 weight percent iron and about 52–54 weight percent nickel.

2. The electronic component of claim 1 wherein the glass tube comprises about 10–20 weight percent silica, about 65–78 weight percent lead oxide, about 5–15 weight percent borate, and about 1–5 percent weight potassium oxide.

3. The electronic component of claim 2 wherein the glass tube further includes about 1–3 weight percent alumina.

4. The electronic component of claim 1 wherein the glass tube consists essentially of silica, lead oxide, borate, and potassium oxide.

5. The electronic component of claim 1 wherein the semiconductor die is a resistor, a diode, a capacitor, an integrated circuit, a thyristor, a thermistor, a Zener diode, or an inductor.

6. The electronic component of claim 5 wherein the glass tube is part of a DO-35, a DO-34, or a DO-41 package.

7. The electronic component of claim 1 wherein the glass tube has a melting temperature ranging from about 535° C. to 545° C.

8. The electronic component of claim 1 further comprising:
    a second lead, wherein the first lead is coupled to a first side of the semiconductor die and the second lead is coupled to a second side of the semiconductor die; and
    a bonding material between the second lead and the semiconductor die.

9. The electronic component of claim 8 wherein the bonding material includes a layer of tin and a layer of silver.

10. The electronic component of claim 1 wherein the glass tube has a melting temperature ranging from about 525° C. and 570° C.

11. The electronic component of claim 1, said dumet having an axial thermal expansion coefficient and a radial thermal expansion coefficient, wherein the radial thermal expansion coefficient is within about 15 percent of the axial thermal expansion coefficient.

* * * * *